(12) United States Patent
Smith et al.

(10) Patent No.: US 6,783,620 B1
(45) Date of Patent: Aug. 31, 2004

(54) THIN-LAMINATE PANELS FOR CAPACITIVE PRINTED-CIRCUIT BOARDS AND METHODS FOR MAKING THE SAME

(75) Inventors: Terrence A. Smith, Hillsboro, OR (US); Howard R. Elliott, Gaston, OR (US)

(73) Assignee: Matsushita Electronic Materials, Inc., Forest Grove, OR (US)

( * ) Notice: Subject to any disclaimer, the term of this patent is extended or adjusted under 35 U.S.C. 154(b) by 0 days.

(21) Appl. No.: 09/655,014

(22) Filed: Sep. 5, 2000

Related U.S. Application Data

(63) Continuation-in-part of application No. 09/503,864, filed on Feb. 14, 2000, and a continuation-in-part of application No. 09/170,933, filed on Oct. 13, 1998, now Pat. No. 6,114,015.

(51) Int. Cl.$^7$ .............................................. B32B 31/18
(52) U.S. Cl. ........................ 156/154; 156/267; 156/268; 156/297; 156/299; 156/300
(58) Field of Search ................................. 156/267, 268, 156/297, 299, 300, 153, 154; 29/25.42; 428/192, 209; 83/869; 409/138, 303

(56) References Cited

U.S. PATENT DOCUMENTS 193,256 A * 7/1877 Keith ........................... 269/89

(List continued on next page.)

FOREIGN PATENT DOCUMENTS

| EP | 0 485 790 A2 | 10/1991 |
| JP | 4-162585 | 6/1992 |
| JP | 05-229059 A | 9/1993 |
| JP | 6-114797 | 4/1994 |
| JP | 09-017905 A | 5/1997 |

OTHER PUBLICATIONS

Clyde F. Coombs Jr., *Printed Circuits Handbook* (McGraw–Hill Companies, Inc., 1995), 4$^{th}$ Ed., 22.4–22.11.
Translation of Japanese patent document 4–162585 (Koji) cited in Applicant's previous Information Disclosure Statement.

*Primary Examiner*—Richard Crispino
*Assistant Examiner*—George R. Koch, III
(74) *Attorney, Agent, or Firm*—Klarquist Sparkman, LLP

(57) ABSTRACT

The present invention provides thin-laminate panels (i.e., thin-laminate panels having dielectric layers of about 0.006 inches or less and conductive layers on either side of the dielectric layer), wherein the edges of the dielectric layers of the panels are free of conductive material, such as copper. The thin-laminate panel is designed to provide necessary capacitance for all or a substantial number of the integrated circuits to be formed thereon. The thin-laminate panels of the present invention may be tested for manufacturing defects, such as short circuits, before further processing of the panels to produce PCBs. "Finishing" methods for shearing sheets of unfinished thin-laminate into the finished thin-laminate panels of the present invention in a manner that does not cause smearing of the conductive material onto the dielectric layer are also provided. To assure that conductive material from the conductive layers of an unfinished thin-laminate panel is not smeared onto the edges of the dielectric layer as the panel is sheared, the plane of rotation of a vertically mounted router bit coincides with the plane defined by the surface of the panel. Securing apparatus or fixtures for securing one or more unfinished thin-laminate panels to a surface for shearing of the edges of the panels to produce the finished thin-laminate panels of the present invention are also provided. The securing apparatus allow unfinished panels to be secured to a surface during the finishing process without the need to drill holes through or otherwise diminish the useful area or portions of the panels. Also disclosed is a method for cutting thin-laminate panels from at least one thin laminate sheet using a circular saw blade within specific operating parameters so that the panels have substantially no conductive material on their dielectric layer edges.

14 Claims, 4 Drawing Sheets

U.S. PATENT DOCUMENTS

| | | | |
|---|---|---|---|
| 3,369,293 A | | 2/1968 | Tillotson |
| 3,555,964 A | | 1/1971 | Fleming |
| 3,768,351 A | | 10/1973 | Stepan |
| 3,819,990 A | | 6/1974 | Hayashi et al. |
| 3,857,074 A | | 12/1974 | Heywang et al. |
| 3,863,316 A | | 2/1975 | Yeo |
| 3,913,196 A | | 10/1975 | Maday |
| 4,103,102 A | | 7/1978 | Klein |
| 4,138,924 A | | 2/1979 | Seebach |
| 4,158,987 A | | 6/1979 | Smith |
| 4,212,570 A | | 7/1980 | Larsson |
| 4,302,501 A | | 11/1981 | Nagashima |
| 4,343,088 A | | 8/1982 | Farley et al. |
| 4,532,839 A | * | 8/1985 | Easton ............ 83/29 |
| 4,657,452 A | | 4/1987 | Astigiano et al. |
| 4,670,080 A | | 6/1987 | Schwarz et al. |
| 4,742,615 A | | 5/1988 | Lopez |
| 4,751,146 A | | 6/1988 | Maeda et al. |
| 4,771,362 A | | 9/1988 | Behn |
| 4,785,137 A | | 11/1988 | Samuels |
| 4,804,428 A | | 2/1989 | Held |
| 4,830,554 A | | 5/1989 | Lopez |
| 4,856,400 A | * | 8/1989 | Kelzer ............ 83/885 |
| 4,961,806 A | | 10/1990 | Gerrie et al. |
| 4,985,982 A | * | 1/1991 | Lohr et al. ............ 29/566.001 |
| 4,988,241 A | | 1/1991 | Colligan |
| 5,002,439 A | | 3/1991 | Lauder |
| 5,010,641 A | | 4/1991 | Sisler |
| 5,027,505 A | | 7/1991 | Nakamura et al. |
| 5,079,069 A | | 1/1992 | Howard et al. |
| 5,097,390 A | | 3/1992 | Gerrie et al. |
| 5,125,138 A | | 6/1992 | Shaw et al. |
| 5,155,655 A | | 10/1992 | Howard et al. |
| 5,161,086 A | | 11/1992 | Howard et al. |
| 5,162,977 A | | 11/1992 | Paurus et al. |
| 5,216,358 A | | 6/1993 | Vaucher |
| 5,261,153 A | | 11/1993 | Lucas |
| 5,357,672 A | | 10/1994 | Newman |
| 5,554,928 A | | 9/1996 | Stinger |
| 5,638,251 A | | 6/1997 | Goel et al. |
| 5,692,286 A | | 12/1997 | Barthelemy |
| 5,800,575 A | | 9/1998 | Lucas |
| 5,824,177 A | * | 10/1998 | Yoshihara et al. ............ 156/250 |
| 5,870,274 A | | 2/1999 | Lucas |
| 6,038,336 A | | 3/2000 | Jin |
| 6,398,892 B1 | * | 6/2002 | Noguchi et al. ............ 156/85 |

* cited by examiner

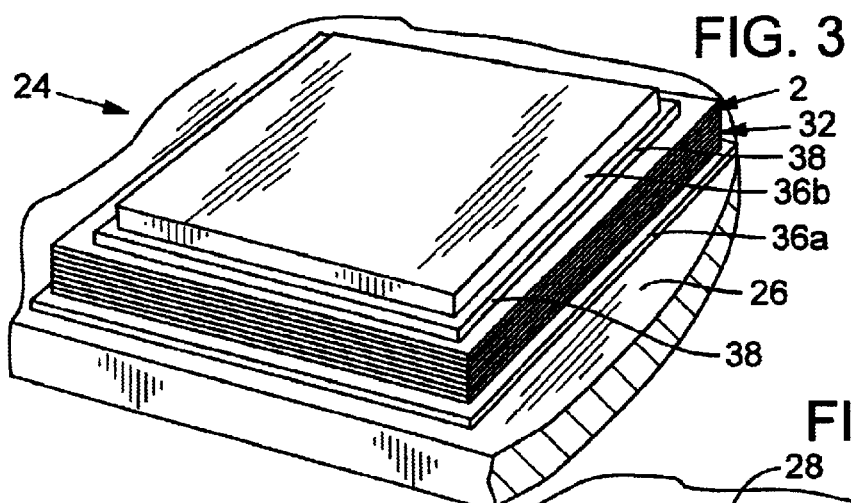
FIG. 3
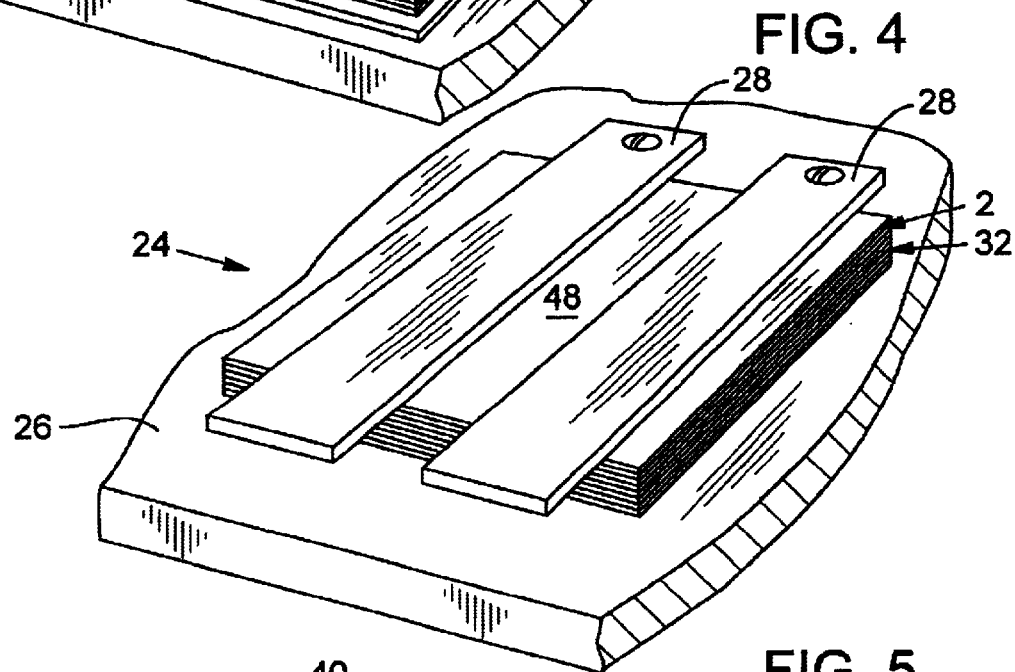
FIG. 4
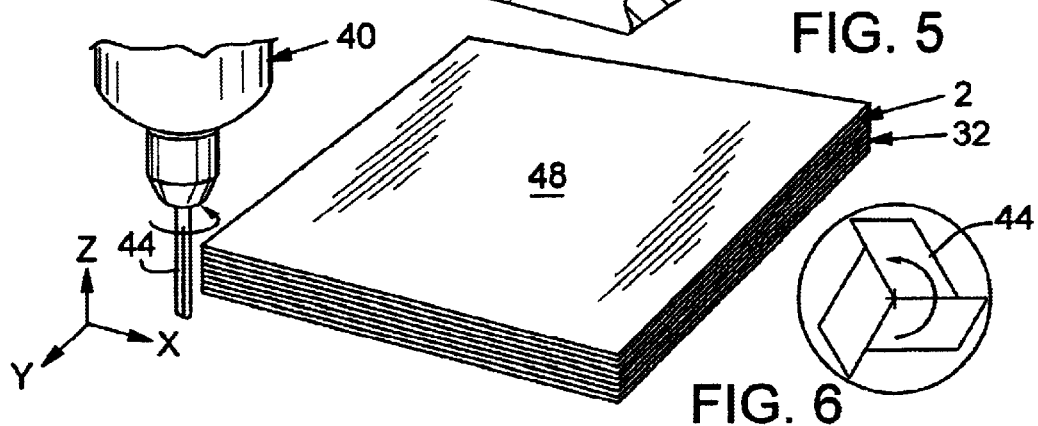
FIG. 5
FIG. 6

THIN-LAMINATE PANELS FOR CAPACITIVE PRINTED-CIRCUIT BOARDS AND METHODS FOR MAKING THE SAME

RELATED APPLICATIONS

This application is a continuation-in-part application of application Ser. No. 09/170,933, filed Oct. 13, 1998 (issued Sep. 5, 2000, as U.S. Pat. No. 6,114,015), and application Ser. No. 09/503,864, filed Feb. 14, 2000.

TECHNICAL FIELD OF THE INVENTION

The present invention concerns thin-laminate panels used to form capacitive printed-circuit boards, and more particularly copper-clad thin-laminate panels and methods for making the same.

BACKGROUND OF THE INVENTION

Conductor plates ("layers") or printed circuit boards (PCBs) are typically made of one or more panels of insulating or dielectric material having a continuous thin-layer of a conductive material, such as copper, laminated one or both sides thereof. A desired layout or pattern of conducting paths and connection areas of printed circuits is then made by removing selected regions of the conductive layer from the dielectric material, to produce a PCB. One or more devices (typically integrated circuits) are then formed on or mounted on the PCB.

More specifically, each panel of the PCB typically includes a dielectric material, such as resin-impregnated fiberglass cloth layer ("dielectric layer"). The panel further includes thin conductive layers (e.g., copper foil) laminated to each side of the dielectric layer. The thin-laminate panels provide necessary capacitance for all or a substantial number of the integrated circuits formed on the "capacitive" PCB.

Conventional PCBs are made of multiple, thick panels (termed "thick laminates") having a thickness of about 0.059 inches or more (i.e., about 1.5 mm). However, electrical engineers are designing integrated circuits that require thinner and thinner dielectric spacing between the conductive layers that form the printed circuits. Accordingly, the thickness of the dielectric material in such panels (and thus the distance between the conductive layers) has become relatively small, typically about 0.006 inches (i.e., about 1.5 mm) or less. The actual thickness of a particular dielectric layer of a thin-laminate panel is determined based on the level of capacitance necessary for the particular integrated circuits to be formed on the capacitive PCB made from the panel. Such laminate panels are termed "thin laminates" or "thin-laminate panels."

The failure rate of the thin-laminate panels used to make capacitive PCBs is often high due to manufacturing defects in the thin-laminate panels themselves. The thin-laminate panels are often defective due to various factors, such as impurities in the material comprising the dielectric layers of the panels. Conductive material introduced into the dielectric layers typically causes shorts between the conductive layers forming the circuit layers (defined by the selective removal of the conductive layers). Thus, the panels would be preferably tested for such manufacturing defects prior to processing the panels to produce the capacitive PCBs. Unfortunately, the prior art thin-laminate panels cannot be accurately tested prior to processing of the PCBs due to the presence of conductive material on the edges of the dielectric layers of the panels.

Specifically, thin-laminate panels are initially made in large sheets and the sheets are then sheared into relatively small panels from which PCBs are made. With reference to the prior art thin-laminate panel illustrated in FIG. 1(a), as the large sheets of thin laminate are cut or sheared to provide multiple thin-laminate panels, the relatively soft conductive layer 6 of the laminate typically smears and spreads conductive material 6a across one or more edges 12 of the panel. The connection of the two conductive layers 6 formed via the smeared conductive material 6a makes it difficult to accurately test such panels for electrical deficiencies.

More particularly, the panels would preferably be tested for undesirable electrical connection between the two conductive layers of the panel due to the presence of conductive material within the dielectric layers. Such an electrical connection through the dielectric layer will not be removed with subsequent processing of the PCB. Thus, the connection through the dielectric layer may result in a defective PCB. When testing the panels for such impurities, electrical connection between the two conductive layers due to conductive material on the edge(s) of the dielectric layer, results in false failures. That is, the conductive material on the panel edges make it appear as though there is electrical conductance through the dielectric layer. Put another way, the smeared conductive material on the dielectric layer edge(s) results in short circuits between the conductive layers of the panel, signifying that the panel is defective due to electrical conductance through the dielectric layer, even though the thin-laminate panel may not be defective. The short circuits at the edges of the panels may be avoided by subsequent PCB processing of the panels. However, because conductive material on the edges of the thin-laminate panels cause short circuits that provide false failures, the panels are not tested before processing the panels to produce the PCBs. That is, if the panels are tested before processing the PCB, otherwise non-defective thin-laminate panels are discarded as being defective due to false failures caused by the smeared conductive material. PCB processing of the panels is both expensive and time consuming as are the laminate panels themselves. Thus, effective and accurate testing of the thin-laminate panels before processing the PCBs and the avoidance of false failures provide distinct advantages.

Referring to the prior art thin-laminate panel illustrated in FIG. 1(b), cutting of the panel need not result in conductive material 6a being smeared completely across an edge 12 of the dielectric layer 8 to cause problems. That is, smeared conductive material that only partially covers an edge 12 of a dielectric layer 8 reduces the already small distance between the conductive layers 6 of the panel 2. This reduced distance between the conductive layers makes it difficult to accurately test such panels for electrical deficiencies. When testing the panels, the reduced distance typically allows conduction of electricity from one conductive layer to the other, making it appear as though there is electrical conductance through the dielectric layer. Such panels are then discarded as defective because it is impossible to determine whether the "short circuit" is due to conductive impurities in the dielectric layer or is simply due to conductive material on the edges of the dielectric layer (which would be eliminated during processing of the PCBs). Accordingly, with thin-laminate panels even a minor amount of conductive material on the edge of the dielectric layer may be detrimental.

Because conventional PCBs are made from thick-laminate panels (e.g., about 0.059 inches (about 1.5 mm)), conductive impurities in the dielectric material is typically not a problem due to the relatively thick layer of dielectric material. In other words, the relatively large mass of dielectric material of the dielectric layer typically limits any deleterious affects of such conductive impurities. As a result, conductive material on the edges of the dielectric layer of thick-laminate panels typically is not a problem, as the thick-laminate panels need not be tested.

In the past, bevelers have been used to give the edges of thick-laminate panel PCBs a rounded profile. The rounded profile makes the thick-laminate panel PCBs safer to handle. Such beveling does not (and was not intended to) produce any electrical benefits. That is, once the laminate panels are processed to define the PCBs, there is not any conductive material located at regions of the laminates that would result in smearing. Additionally, current beveling processes require that the thick-laminate PCBs be beveled one at a time.

Accordingly, there is a need for thin-laminate panels for the production of PCBs, wherein the thin-laminate panels have edges that have been finished so that the edges are free of conductive material. The absence of conductive material on the edges of the dielectric layers of the panels allows testing of the panels for manufacturing defects prior to processing of the PCBs and avoids discarding non-defective thin-laminate panels due to false failures. Further, there is a need for methods for finishing edges of thin-laminate panels in a manner that does not cause smearing of conductive material along the edges of the dielectric layers and apparatus for performing the same.

SUMMARY OF THE INVENTION

In light of the deficiencies of the prior art, the present invention provides "finished" thin-laminate panels having dielectric layers of about 0.006 inches or less. Thin conductive layers (e.g., copper) are laminated on either side of the dielectric layers and the edges of the dielectric layers of the thin-laminate panels are finished to be free of conductive material. As discussed above, the thin-laminate panels are designed to provide necessary capacitance for all or a substantial number of integrated circuits to be mounted on or formed on a PCB made from one or more of the panels. The finished thin-laminate panels of the present invention may be tested for manufacturing defects, such as short circuits, before further processing of the panels to produce PCBs. Further, such testing may be done without the risk of false failures resulting in discarding of non-defective panels, because the edges of the dielectric layers of the panels of the present invention are free of conductive material.

The present invention further provides "finishing" methods for removing conductive material from the edges of the unfinished thin-laminate panels in a manner that does not cause further smearing of the conductive material onto the dielectric layer. Preferably a CNC router having a vertically mounted router bit is used. To assure that conductive material from the conductive layers of an unfinished thin-laminate panel is not smeared onto the edges of the dielectric layer as a portion of the edge of the panel is removed, the rotation of the router bit is made to coincide with the plane defined by the surface of the panel. Additionally, the router bit has cutting edges that extend axially rather than spirally or helically, so that the cutting action is in the direction of the router bit rotation. Further, the router bit is not moved vertically relative to the plane of the panel at any point during the shearing process.

In an alternative embodiment of the present invention, thin-laminate panels are cut from a thin-laminate sheet using a circular saw blade. To significantly reduce smearing of conductive material onto one or more edges of the dielectric layer of the panel being cut from the sheet, a circular saw blade having a specified number of teeth is utilized. Further, the blade is rotated within a specific RPM range, and is operated to cut the sheet into panels within a specific range of speed. Such saw blade "paramenters" substantially prevent smearing of conductive material from the conductive layers of the sheet onto the edges of the dielectric layer as the panel is cut from the sheet. If necessary, the panel edges are then "finished" by removing small portions of one or more of the edges of the panel using an abrasive material, such as sandpaper.

The present invention further provides securing apparatus or fixtures for securing one or more unfinished thin-laminate panels to a surface for removal of conductive material from the dielectric layer edges. The thin-laminate panels are mounted in the securing apparatus to shear the edges of the panels and produce the finished thin-laminate panels of the present invention. Such securing apparatus of the present invention allows the panels to be secured to a surface during the shearing process without the need to drill holes through or otherwise diminish useful portions of the panels.

The foregoing and other objects, features, and advantages of the invention will become more apparent from the following detailed description of preferred embodiments that proceed with reference to the accompanying drawings.

BRIEF DESCRIPTION OF THE DRAWINGS

FIG. 1(*b*) is a side view of another prior art thin-laminate panel.

FIG. 3 is a perspective view of a first embodiment of the thin-laminate panel securing apparatus of the present invention.

FIG. 4 is a perspective view of a second embodiment of the thin-laminate panel securing apparatus of the present invention.

FIG. 5 is an oblique view that illustrates the vertical orientation of a router relative to a stack of thin-laminate panels, used to practice one of the methods of the present invention.

FIG. 6 is a partial plan view of blades of a router bit used to practice one of the methods of the present invention.

DESCRIPTION OF THE INVENTION

The present invention provides "finished" thin-laminate panels. The thin-laminate panels include dielectric layers having thicknesses of about 0.006 inches or less and, preferably about 0.002 inches or less. The dielectric layers have conductive layers on either side thereof. The edges of the dielectric layers of the finished thin-laminate panels are free of conductive material.

As used herein, the term "finished" refers to the mechanical or abrasive removal of a portion of one or more edges of a thin-laminate panel or the mechanical, chemical, or abrasive removal of conductive material from one or more edges of the dielectric layer of a thin-laminate panel, such that the edges of the dielectric layer of the finished thin-laminate panel are free of conductive material.

Figure 2:
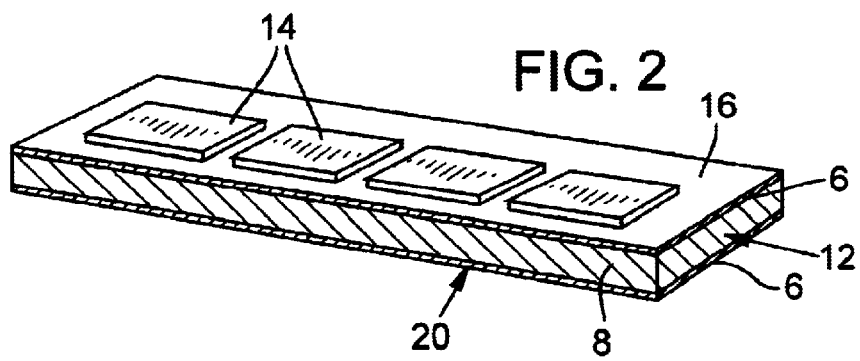
FIG. 2 is a perspective view of a preferred embodiment of the finished thin-laminate panel of the present invention.

More specifically, referring to FIG. 2, the thin-laminate panel 2 of the present invention preferably includes two sheets or layers 6 of conductive material and an intermediate sheet or layer 8 of dielectric material. The conductive layers 6 and dielectric layer 8 are joined together such as by lamination, to form a structurally firm assembly to form the thin-laminate panel 2. The thin-laminate panel 2 is sufficiently firm to facilitate manufacture of the panel, preferably by lamination of separate layers and also to facilitate the manufacture of capacitive printed-circuit boards therefrom. The structurally firm assembly of the thin-laminate panel 2 may be substantially rigid, flexible, or resilient depending upon the intended end use of the panel. Although only a single thin-laminate panel is shown in FIG. 2, one or more of the thin-laminate panels may be used as the internal components of a PCB.

As discussed above, the thin-laminate panel 2 is designed to provide necessary capacitance for all or a substantial number of integrated circuits 14 to be mounted on or formed on a capacitive PCB made of the thin-laminate panel(s). In general, the materials chosen to form the conductive layers 6 and the dielectric layer 8 and the thicknesses of the individual layers, are chosen according to state-of-the-art technology.

Particularly, to provide the necessary level of capacitance, the dielectric layers of the thin-laminate panel 2 has carefully controlled values of thickness. Further, materials suitable to form the dielectric layer 8 are chosen to have dielectric constants sufficient to satisfy the capacitance requirements. The dielectric materials may comprise any suitable capacitive material as known to those persons skilled in the art. The choice of dielectric material in part depends upon the extent of flexibility or rigidity desired for the resulting thin-laminate panel. For example, the dielectric material may comprise a plastic film, such as acrylics or polyimides, e.g., KAPTON® available from DuPont. The dielectric materials may alternatively comprise reinforcement impregnated with a resin. The dielectric material reinforcement is preferably chosen from the group consisting of woven or non-woven fiberglass, quartz, cellulose, paper, aromatic polyamide fibers, (such as KEVLAR® or THERMOUNT®—both available from DuPont), and mixtures thereof. The resin is preferably chosen from the group consisting of thermoplastic resins, thermoset resins, and mixtures thereof. For the present invention, the dielectric layer has a thickness of from about 0.0005 inches to about 0.01 inches, and preferably from about 0.001 inches to about 0.006 inches. A dielectric layer having a thickness of about 0.002 inches has been found to be especially useful.

The conductive layer 6 is provided with sufficient conductive material, either in terms of mass per unit area or in terms of thickness, to permit adequate current flow necessary to provide each integrated circuit formed on the PCB with sufficient capacitance for its proper operation. The conductive material is preferably formed from any of a variety of conductive material, such as conductive metals and conductive inks. Preferably, the conductive material comprises a conductive metal, such as aluminum, silver, gold, copper, in and mixtures thereof. For the present invention, the conductive layers are most preferably formed of copper because of its superior conductive characteristics compared to all other non-precious metals. The conductive layers 6 preferably have a thickness of from about 0.0001 inches to about 0.01 inches, and more preferably about 0.0014 inches (i.e., about 0.32 mm).

The distance between the conductive layers 6, throughout the conductive layers and at the edges of the panel, is precisely controlled by controlling the thickness of the dielectric layer 8 and the conductive layers 6. The thin-laminate panels of the present invention further include an "edge finish" wherein the edges of the dielectric layers have been mechanically, abrasively, or chemically treated to be free of conductive material. (In an alternative embodiment, to cut thin-laminate panels having substantially no conductive material on the dielectric layer edges, panels are cut from the thin-laminate sheet using a specific circular saw blade. The circular saw blade is operated within specific parameter ranges. The edges may be "finished" if necessary, by removing a relatively small portion of one or more edges of the panel using, for example, an abrasive material such as sandpaper. The circular saw blade method of the present invention is discussed below.) The absence of conductive material on any portion of the edges of the dielectric layer 8 allows the thin-laminate panel to be tested for electrical conductance, such as by high-potential testing (described below), to determine the presence or absence of conductive impurities within the dielectric layer 8 or to detect other electrical defects within the thin-laminate panel, without the loss of discarded panels due to false failures. Further, the interfaces between the dielectric layer 8 and each of the conductive layers 6, are distinct to control the thicknesses between the conductive layers 6.

The thin-laminate panel 2 of the present invention may be tested for electrical defects, such as the presence of conductive impurities within the dielectric layer 8, by use of standard tests for electrical conductance as known to those persons skilled in the art. For example, a high-potential (high-voltage) test may be performed using a megohm meter (e.g., a Hipotronics HMA3A Megohm Meter). A relatively high voltage is applied to the conductive layer 6 on a first surface 16 of the thin-laminate panel 2. Any corresponding voltage at the conductive layer 6 on a second surface 20 of the panel 2 is then detected. A defective thin-laminate panel will conduct current from the first surface 16 of the panel to the second surface 20. As discussed above, if the thin-laminate panel 2 has conductive material on the edges 12 of the dielectric layer 8, as does the prior art thin-laminate panels, such a test for electrical defects in the panel could not be performed to accurately determine whether the panel is defective.

The present invention also provides methods for finishing the edges of thin-laminate panels to produce the thin-laminate panels of the present invention. One method of the present invention provides a process for removing relatively small edge portions of an unfinished thin-laminate panel. The finishing method removes any conductive material present on one or more edges of the dielectric layer 8. Additionally, the finishing method is performed in a manner that does not cause further smearing of conductive material from the conductive layers 6 of the panel onto one or more edges 12 of the dielectric layer 8.

Figure 1A:
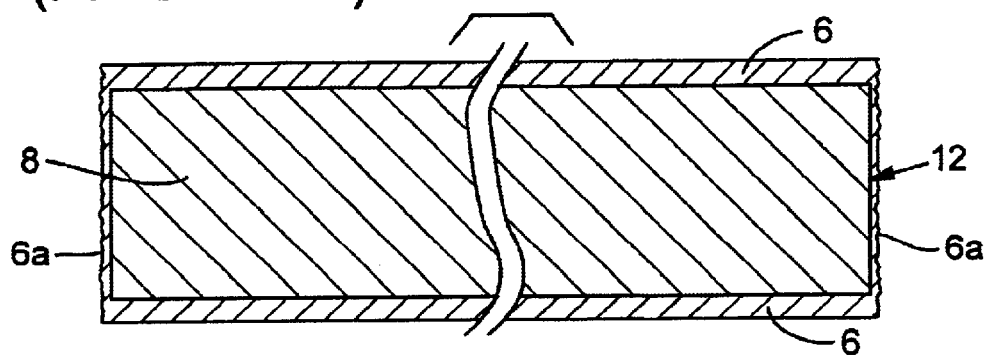
FIG. 1(*a*) is a side view of a prior art thin-laminate panel.
Figure 1B:
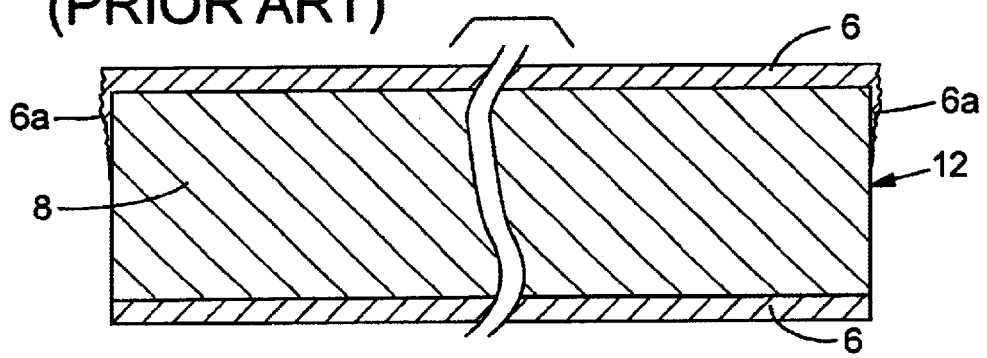

First, relatively large sheets (not shown) of thin-laminate are made according to state-of-the-art technology, e.g., according to the methods disclosed in U.S. Pat. No. 5,079,069 issued Jan. 7, 1992 to Howard et al., U.S. Pat. No. 5,155,655 issued Oct. 13, 1992 to Howard et al., U.S. Pat. No. 5,161,086 issued Nov. 3, 1992 to Howard et al., and U.S. Pat. No. 5,261,153 issued Nov. 16, 1993 to Lucas, all of which are incorporated herein by reference. The large thin-laminate sheets are then cut into multiple (unfinished) thin-laminate panels. As discussed above, as the panels are cut from the large laminate sheets, conductive material is typically smeared from one or more of the conductive layers of the thin-laminate sheet onto the dielectric layer edge. The smeared conductive material forms a thin region of conductive material 6a on one or more edges 12 of the dielectric layer 8 of the thin-laminate panel (e.g., see prior art FIGS. 1(a) and 1(b)). A preferred finishing method of the present invention provides a process for milling or abrading a small portion of the panel edges to remove conductive material from the edges 12 of the dielectric layer 8 of the unfinished panel.

Referring to FIG. 4, one or more thin-laminate panels may be finished at one time. In finishing the edges, a single thin-laminate panel 2 or a stack 32 of thin-laminate panels, is held in place using a securing apparatus 24. The securing apparatus 24 may comprise a pair of metal plates 28 connected to a supporting surface 26. The stack 32 of unfinished thin-laminate panels is placed between the pair of metal plates 28 and the underlying table or supporting surface 26. The metal plates 28 are preferably bolted to the supporting surface 26 at one or both ends so that the stack 32 of unfinished panels is held securely between the metal plates 28 and the supporting surface 26 without the need to tool holes in the panels.

Alternatively, referring to FIG. 3, the securing apparatus 24 of the present invention may comprise a lower backer board 36a used in conjunction with an upper backer board 36b. The lower backer board 36a is comprised of a material or has a surface that has sufficient friction such that an unfinished thin-laminate panel placed directly on the lower backer board 36a is held securely in place with the aid of the upper backer board 36b, as the edges of the panels are sheared. The lower backer board 36a preferably comprises a relatively thin sheet of a material that is sufficiently pliant such that it does not damage the conductive layer 6 of the thin-laminate panel 2. For example, the lower-backer board 36a may comprise closed-cell foam (e.g., NEOPRENE® available from Denka Chemical Corporation of Houston, Tex.).

The upper backer board 36b acts as a weight placed on the top of the stack 32 of panels to help hold the stack in place as the panels are treated. The upper backer board 36b preferably is of a sufficient weight to securely hold the stack 32 of panels in place without causing damage to the panels. The upper backer board 36b is sized smaller in area relative to the area of the unfinished thin-laminate panels so that the edges of each panel may be finished (as described below) without interference with the upper backer board 36b. The upper backer board 36b preferably comprises a one inch steel plate (e.g., weighing about 30 lbs.). In an alternative embodiment, a protective layer (not shown), preferably comprising a composition hardboard such as MASONITE®, is positioned between the stack 32 of panels and the upper backer board 36b. The protective layer protects the conductive layer 6 of the uppermost panel in the stack from being damaged by the upper backer board 36b. The protective layer is preferably of a size that the upper backer board does not directly contact the stack 32.

In operation, the lower backer board 36a is placed on the supporting surface 26. A stack 32 of unfinished thin-laminate panels is then placed on the lower backer board 36a. The protective layer 38 and upper backer board 36b are then placed on top of the stack 32 in a manner such that the edges of the panels may be finished without interference with the upper backer board or the protective layer.

It is noted that other securing apparatus may be used to perform the methods of the present invention. For example, the securing apparatus may comprise attachment of one or more unfinished thin-laminate panels to a surface by use of clamps, straps, various weights, suction devices (i.e., vacuum), adhesives, magnets, etc.

Referring to FIG. 5, preferably, a standard computer numerical control (CNC) router 40 is used to finish the thin-laminate panels. A router bit 44 is oriented vertically as shown. In FIG. 5, the Z-axis is parallel to the vertically oriented router bit, the X-axis extends in a direction horizontal with the plane of the page, and the Y-axis extends in a direction perpendicular to the plane of the page. The CNC router 40 is operable to move the router bit 44 in both the X-axis and the Y-axis directions. The router bit 44 is moved along the edge portions of the stack 32 to cut, mill, or abrade off a relatively small portion of each edge of each of the panels in the stack (e.g., typically about 0.125 inches to about 0.250 inches of the panel edges are removed).

To assure that conductive material from the conductive layers 6 of the unfinished thin-laminate panels is not smeared onto the edges 12 of the dielectric layers 8 as the stack 32 of panels is trimmed, the axis of rotation of the router bit 44 is perpendicular to the plane defined by the surface 48 of the stack 32 of panels. To further assure "clean" dielectric layer edges, the router bit 44 has cutting edges or blades that extend axially, rather than helically or spirally (FIG. 6). In other words, the router bit 44 has cutting surfaces that extend only in the X, Y plane. Accordingly, the cutting action of the router bit is in the direction of the router bit rotation R only. Additionally, referring back to FIG. 5, the router bit 44 is not moved along the Z-axis at any point during the finishing of the edges of the panels. A preferred router bit 44 for performing the method of the present invention is a ⅛ inch router bit, such as Router Part No. RI1250, available from Megatool of Buena Park Calif.

When a stack 32 of unfinished thin-laminate panels is mounted in the securing apparatus 24 illustrated in FIG. 4, a pair of opposing edges (A and B) of the stack 32 of panels is first finished by moving the router bit 44 along the Y-axis on both sides of the stack. The stack 32 of partially finished panels is then removed from the securing apparatus 24, rotated 90° and secured again. The two remaining edges of the stack of panels are then finished in the same manner.

When a stack 32 of unfinished thin-laminate panels is mounted in the securing apparatus 24 illustrated in FIG. 3, all four edges of the stack may be finished or sheared (i.e., milled, cut, or abraded) without the need to remove and rotate the stack of panels as is required with the securing apparatus shown in FIG. 4.

Other preferred finishing methods of the present invention for removal of conductive material from the dielectric layer edges employ tools such as water-jet cutting apparatus, laser cutting apparatus, beveling apparatus, and filing, sanding, or milling apparatus, etc., or use chemical etching, rather than use of a router as described above.

Figure 7A:
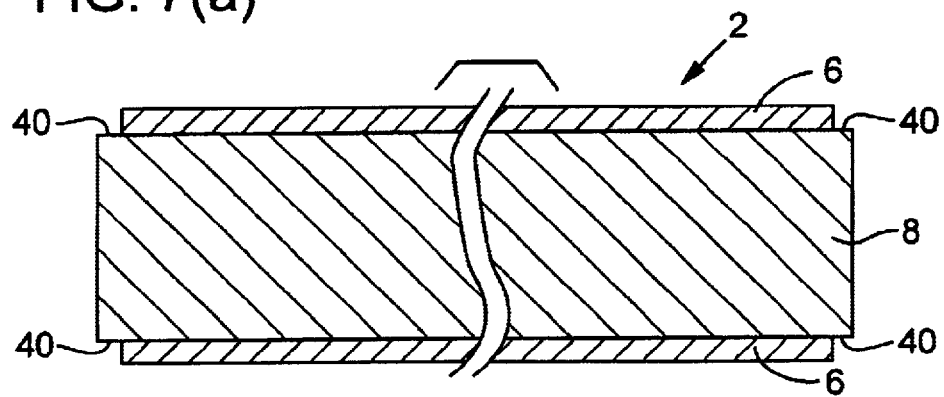
FIGS. 7(*a*) and 7(*b*) are side views of alternative embodiments of the thin-laminated panel of the present invention.

In a second embodiment of the thin-laminate panel 2 (shown in FIG. 7(a)), as with the first embodiment shown in FIG. 2, conductive material is removed from the edges of the dielectric layer 6. In addition, a small end portion of one or more of the conductive layers 6 is removed from the end portions 40 of the dielectric layer 8.

Figure 7B:
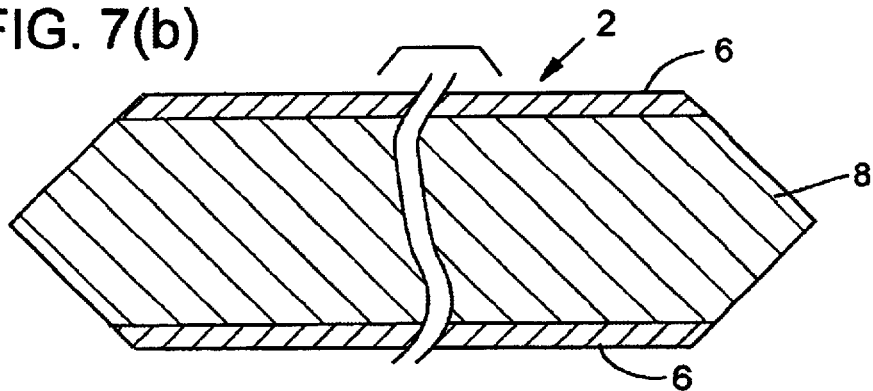

In a third embodiment of the thin-laminate panel 2 (shown in FIG. 7(b)), conductive material is removed from the edges of the dielectric layer 8 by removing one or more corner portions of both the conductive layer 6 and the dielectric layer 8. The third embodiment of the thin-laminate panel 2 may be "finished" by removing one or both of the corner portions of the conductive layers 6 and the dielectric layer 8, using a router bit designed to cut at approximately a 45° angle relative to the plane defined by the surface of the panel. The router bit may include spiral cutting edges positioned to pull material from the dielectric layer 8 to the conductive layer 6 rather than pulling conductive material from the conductive layers 6 to the edges of the dielectric layer 8.

Another method of the present invention provides the thin-laminate panel 2 (FIG. 2) of the present invention, wherein the panels are cut from a thin-laminate sheet 102 (FIG. 9) using a circular saw blade 144. The circular saw blade is operated within specific, interdependent operating parameters. If necessary, edges of the thin-laminate panel are then "finished" by removal of a relatively small portion of the panel edges as described above (e.g., using an abrasive material such as SCOTCH BRIGHT™ abrasive pads).

Figure 8:
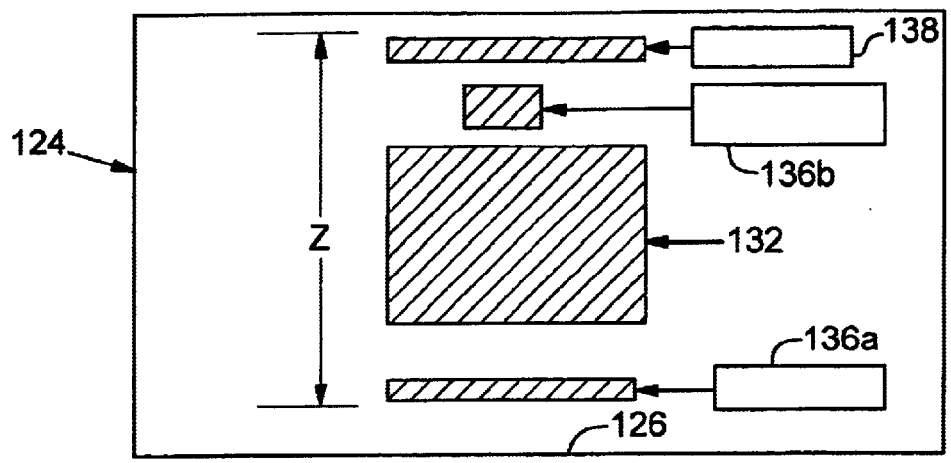
FIG. 8 is an exploded side view of a secured stack of thin-laminate sheets to be cut into thin-laminate panels of the present invention.
Figure 9:
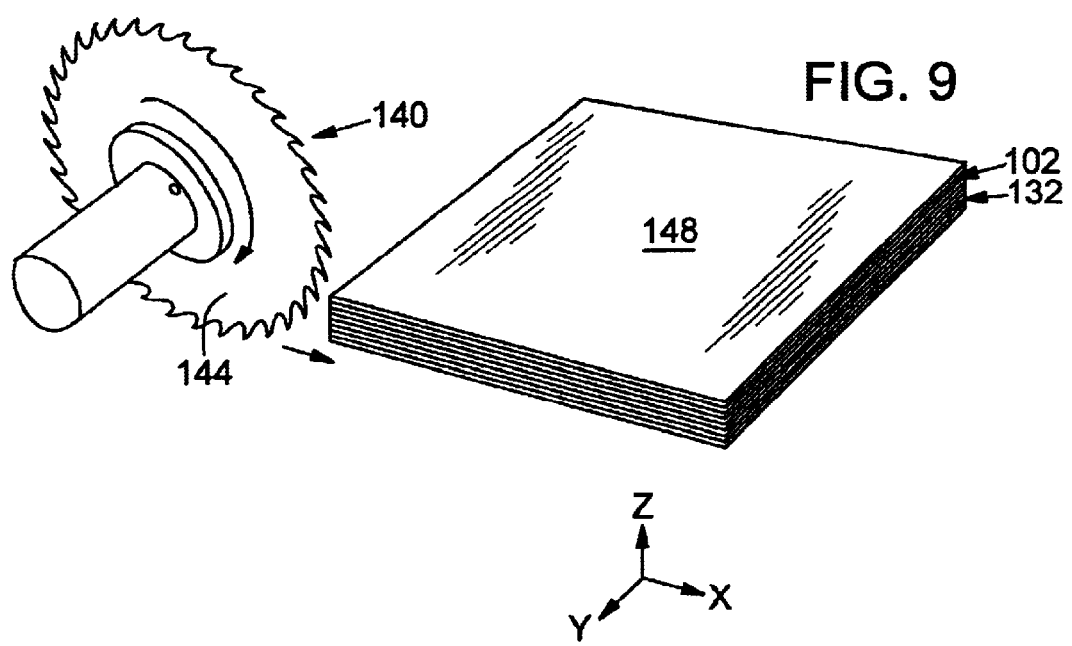
FIG. 9 is an oblique view that illustrates a vertical orientation of an auto-saw blade relative to a stack of thin-laminate sheets to be cut into thin-laminate panels.

Referring to FIGS. 8 and 9, similar to the methods discussed above, one or more thin-laminate sheets 102 may be cut into multiple panels at one time. To cut a thin-laminate sheet 102 or a stack 132 of thin-laminate sheets, the sheets are held in place using a securing apparatus 124. The securing apparatus 124 may comprise a lower backer board 136a used in conjunction with an upper backer board upper backer strip 136b and one or more clamps (not shown). The lower backer board 136a preferably comprises a material having (or has a surface that has) sufficient friction such that an a thin-laminate sheet 102 (or stack of thin-laminate sheets 132) placed directly on the lower backer board 136a is held securely in place with the aid of one or more clamps. The lower backer board 136a preferably comprises a relatively thin sheet of a material that is sufficiently pliant such that it does not damage the conductive layers of the thin-laminate panels to be cut from the sheets 102. For example, the lower-backer board 136a may comprise a closed-cell foam (e.g., NEOPRENE® available from Denka Chemical Corporation of Houston, Tex.) or a phenolic board such as that available from Aerospace Composite Products of San Leandro, Calif.

The upper backer board 136b is preferably placed under the one or more clamps to protect the sheets 102 from the clamp, as the sheets are held in place to be cut into multiple panels. The upper backer board 136b may comprise the same material as that of lower backer board 136a. As discussed above, the upper backer board 136b may act as a weight placed on the top of the stack 132 of sheets to help hold the stack in place as the panels are cut (rather than using one or more clamps to hold the stack in place). Further, the upper backer board 136b preferably extends at least about 1 inch beyond the edge of the stack 132 of thin-laminate sheets such that the 136b is cut along with the stack 132 of thin-laminate sheets. Cutting upper backer board 136b along with the sheets 102 has been found to further reduce the possilbility that conductive material is smeared onto the dielectric layer as the panels are cut from the sheet.

In addition, a protective layer 138, preferably comprising a composition hardboard such as MASONITE® or KRAFT paper, is placed over the upper backer board 136b. The protective layer 138 protects the conductive layer of the uppermost sheet in the stack 132 from being damaged by dust and debris generated as the sheets are cut into panels. The protective layer 138 is preferably of a size that covers the upper backer board and the stack 132 of thin-laminate sheets 102.

In operation, the lower backer board 136a is placed on a supporting surface 126. One or more thin-laminate sheets 102 (i.e., a stack 132) are then placed on the lower backer board 136a. The upper backer board 136b and protective layer 138 are then placed on top of the stack 132 in a manner such that the upper backer board and protective layer are cut as the thin-laminate sheets are cut into panels. The thickness Z (FIG. 8) of the stack 132, the upper and lower backer boards 136a,b and the protective layer 138 preferably comprises about 0.375 inches when cutting thin-laminate sheets each having a thickness of less than or equal to about 0.003 inches. The thickness Z of the stack 132, the upper and lower backer boards 136a,b and the protective layer 138 preferably comprises about 0.500 inches when cutting thin-laminate sheets each having a thickness greater than about 0.003 inches. When cutting ZBC thin-laminate sheets, preferably, from about 50 to about 75 sheets are placed between the upper and lower backer boards to create thickness Z. When cutting thin-laminate panels 2 (FIG. 2) from thin-laminate sheets 102 using a circular saw blade, it is preferable that material remaining from each sheet after all cuts have been made is not less than about 0.1875 inches in width If less than about 0.1875 inches is cut from the sheet 102, smearing of the conductive material is more likely.

It is noted that other securing apparatus may be used to perform this method of the present invention. For example, the securing apparatus may comprise attachment of one or more uncut thin-laminate sheets to a surface by use of straps, various weights, suction devices (i.e., vacuum), adhesives, magnets, etc.

Referring to FIG. 9, preferably, a standard computer numerical control (CNC) auto saw 140 is used to cut thin-laminate panels 2 (FIG. 2) from the thin-laminate sheet 102. (The thin-laminate panels 2 may be cut from a single thin-laminate sheet 102 or from a stack of thin-laminate sheets 132 as discussed above.) A saw blade 144 is oriented vertically as shown. In FIG. 9, the Z-axis is parallel to the vertically oriented saw blade 144, the X-axis extends in a direction horizontal with the plane of the page, and the Y-axis extends in a direction perpendicular to the plane of the page. The auto saw 140 is positioned and operable to move the saw blade 144 in both the X-axis and the Y-axis directions. The saw blade 144 is moved through the stack of thin-laminate sheets 132 (or a single thin-laminate sheet 102) to cut thin-laminate panels 2 (FIG. 2) having desired dimensions.

In an attempt to avoid or significantly reduce any smearing of conductive material from the conductive layers 6 (FIG. 2) onto the edges 12 of the dielectric layers 8 as the panels are cut from the thin-laminate sheet 102 (FIG. 9), the saw blade 144 axis of rotation is substantially perpendicular to the plane defined by the surface 148 of the sheet 102. Further, the saw blade 144 comprises a diamond-tip circular saw blade (or other suitable, equivalent material) and preferably has from about 60 to about 100 teeth. Particularly good results have been obtained using a diamond-tip saw blade having about 84 teeth. A preferred saw blade 144 for cutting the panels of the present invention comprises a LEUCO DIAREX saw blade Z60 or Z84 (or an equivalent saw blade), available from Leuco Australia Pty. Ltd. of Revesby, Australia.

To further ensure "clean" dielectric layer edges of the panels, when cutting the panels 2 (FIG. 2) from the thin-laminate sheet 102 (FIG. 9), the saw blade 144 is operated at about 3,500 rpm. Further, the cutting speed is preferably from about 8 to about 15 feet per minute when performing a separation cut. A separation cut is defined as a cut wherein the material to be removed is greater than about 0.5 inches on both sides of the saw blade 144. In other words, a separation cut occurs when there is relatively more sheet area to which heat from the saw blade 144 will transfer as the panels are being cut from the sheet. The cutting speed for a dust cut is preferably 3 feet per minute. A dust cut is defined as a cut wherein the material to be removed is from about 0.1875 inches to about 0.5 inches on both sides of the saw blade 144. In other words, a dust cut occurs when there is relatively less sheet area to which heat from the saw blade 144 will transfer as the panels are being cut from the sheet. The rpm of the blade 144 can be increased or decreased, but the speed of the cut must likewise be relatively increased or decreased. The cut speed (or other auto saw operating parameters) may vary slightly depending upon the particular materials forming the thin-laminate sheets.

After the thin-laminate panels 2 are cut using the auto saw (under the above-outlined parameters), if necessary, the edges of the panels may be finished using the methods described above. To determine whether such finishing is necessary, the edges may be visually or physically examined for roughness or may be electrically tested by use of standard tests for electrical conductance as known to those persons skilled in the art.

Whereas the invention has been described with reference to several embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A method of cutting thin-laminate panels from a thin-laminate sheet, the thin-laminate sheet comprising a layer of dielectric material positioned between two layers of conductive material, the method comprising:
   placing the thin-laminate sheet on a lower backer board, wherein the thin-laminate sheet has a thickness of about 0.006 inches or less;
   placing an upper backer board over the thin-laminate sheet;
   placing a protective layer over the upper backer board; and
   cutting the sheet into one or more thin-laminate panels having edges around the panel using a circular saw blade operating at about 3,500 rpm, such that at least one end edge of the layer of dielectric material is substantially free of conductive material.

2. The method of claim 1, wherein a relatively small portion of one or more edges of the panels are removed from the panel after the panel is cut from the thin-laminate sheet, such that at least one end edge of the layer of dielectric material of the panel is substantially free of conductive material.

3. The method of claim 1, wherein the panels are cut from the thin-laminate sheet at from about 8 to about 15 feet per minute.

4. The method of claim 1, wherein the saw blade comprises a diamond-tip circular blade.

5. The method of claim 1, wherein the saw blade comprises from about 60 to about 100 teeth.

6. The method of claim 2, wherein the removing a relatively small portion of one or more edges of the one or more multiple thin-laminate panels comprises a removal process selected from the group consisting essentially of a mechanical removal process, a chemical removal process, and an abrasive removal process.

7. A method of cutting thin-laminate panels from at least one thin-laminate sheet, the method comprising:
   providing a thin-laminate sheet comprising a layer of dielectric material positioned between two layers of conductive materials wherein the thin-laminate sheet has a thickness of about 0.006 inches or less;
   placing the thin-laminate sheet on a lower backer board;
   placing an upper backer board over the thin-laminate sheet; and
   cutting the thin-laminate sheet into one or more thin-laminate panels using a circular saw blade such that edges of the layer of dielectric material are substantially free of conductive material.

8. The method of claim 7 wherein the method includes placing a protective layer over the upper backer board prior to cutting, and wherein the cutting comprises cutting the thin-laminate sheet, the upper backer board and the protective layer at about 8 to about 15 feet per minute.

9. The method of claim 7 wherein the cutting of the thin laminate sheet produces remains from the thin-laminate sheet greater than or equal to about 0.1875 inches in width.

10. The method of claim 7 wherein the thin-laminate sheet is cut with the circular saw blade operating at about 3,500 mm.

11. A method of cutting multiple thin-laminate panels from a stack of thin-laminate sheets, the method comprising:
   providing thin-laminate sheets each comprising a layer of dielectric material positioned between two layers of conductive material, wherein the thin-laminate sheets each have a thickness of about 0.006 inches or less;
   forming a stack of thin-laminate sheets;
   placing the stack of thin-laminate sheets on a lower backer board;
   placing an upper backer board over the stack of thin-laminate sheets, and
   cutting the stack of thin-laminate sheets such that edges of the layer of dielectric material are substantially free of conductive material using a circular saw blade at from about 8 to 15 feet per minute.

12. The method of claim 11 wherein the method includes placing a protective layer over the upper backer board prior to cutting and wherein the thickness of each thin-laminate sheet is less than or equal to about 0.003 inches and the overall thickness of the stack of thin-laminate sheets, the lower backer board, the upper backer board, and the protective layer is equal to or less than about 0.375 inches.

13. The method of claim 11 wherein the method includes placing a protective layer over the upper backer board prior to cutting and wherein the overall thickness of the stack of thin-laminate sheets, the lower backer board, the upper backer board, and the protective layer is equal to or less than about 0.5 inches.

14. The method of claim 11 wherein the stack of thin-laminate sheets comprises about 50 to about 75 thin-laminate sheets.

* * * * *

UNITED STATES PATENT AND TRADEMARK OFFICE
CERTIFICATE OF CORRECTION

| | |
|---|---|
| PATENT NO. | : 6,783,620 B1 |
| APPLICATION NO. | : 09/655014 |
| DATED | : August 31, 2004 |
| INVENTOR(S) | : Terrence A. Smith and Howard R. Elliott |

It is certified that error appears in the above-identified patent and that said Letters Patent is hereby corrected as shown below:

Column 10, line 19, "width" should read -- width. --

Column 12, line 28, "mm." should read -- rpm. --

Signed and Sealed this

Eleventh Day of July, 2006

JON W. DUDAS
*Director of the United States Patent and Trademark Office*